United States Patent
Kuniyoshi et al.

(10) Patent No.: US 6,753,476 B1
(45) Date of Patent: Jun. 22, 2004

(54) FLAME-RETARDANT ADHESIVES AND CIRCUIT MATERIALS WITH THE USE OF THE SAME

(75) Inventors: Atsushi Kuniyoshi, Tochigi (JP); Takato Fujii, Tochigi (JP); Masayuki Kumakura, Tochigi (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/688,151

(22) Filed: Oct. 16, 2000

(30) Foreign Application Priority Data

Oct. 28, 1999 (JP) .......................................... 11-306699
Dec. 2, 1999 (JP) .......................................... 11-342711

(51) Int. Cl.[7] .............................................. H01B 7/00
(52) U.S. Cl. ............................... 174/110 R; 174/117 R; 174/117 F
(58) Field of Search ..................... 174/110 R, 113 R, 174/113 A, 117 F, 117 FF, 36; 428/212, 354, 355 R, 920, 921, 480; 523/199; 106/18.11, 18.13, 18.21, 18.26, 18.27, 18.29, 18.31, 18.32, 18.14, 18.36

(56) References Cited

U.S. PATENT DOCUMENTS

| | | | |
|---|---|---|---|
| 4,072,653 A | * 2/1978 | Moedritzer | 260/45.7 |
| 4,353,954 A | * 10/1982 | Yamaoka et al. | 428/216 |
| 4,659,872 A | * 4/1987 | Dery et al. | 174/117 A |
| 5,041,183 A | * 8/1991 | Nakamura et al. | 156/264 |
| 5,250,127 A | * 10/1993 | Hara | 156/52 |
| 5,578,666 A | 11/1996 | Weil et al. | 524/100 |
| 5,674,947 A | * 10/1997 | Oishi et al. | 525/289 |
| 6,146,557 A | * 11/2000 | Inata et al. | 252/609 |
| 6,166,114 A | * 12/2000 | Cosstick et al. | 524/100 |
| 6,225,383 B1 | * 5/2001 | Hirono et al. | 524/100 |
| 6,333,095 B1 | * 12/2001 | Ueno et al. | 428/212 |
| 2001/0020537 A1 | * 9/2001 | Ueno et al. | 174/68.1 |

FOREIGN PATENT DOCUMENTS

| | | | |
|---|---|---|---|
| JP | 52-047831 | 4/1977 | |
| JP | 54-141792 A1 | * 11/1979 | .......... C07D/51/54 |
| JP | A 5-4997 | 1/1993 | |
| JP | 05-004997 A | * 1/1993 | .......... C07F/9/38 |
| JP | 06-286081 A | * 10/1994 | .......... B32B/27/30 |
| JP | 07-258479 A | * 10/1995 | .......... C08L/23/00 |
| JP | A 8-60108 | 3/1996 | |
| JP | 10-120881 A1 | * 5/1996 | .......... C08K/13/04 |
| JP | 10-316843 A1 | * 5/1997 | .......... C08L/67/02 |
| JP | 09-176591 | 7/1997 | |
| JP | 2000-212412 A1 | * 1/1999 | .......... C08L/67/02 |
| JP | WO99/60069 A | * 11/1999 | .......... C09J/167/00 |
| JP | 2001-345990 A | * 12/1999 | .......... C08K/5/53 |
| JP | WO00/11109 A | * 2/2000 | .......... C09K/21/12 |
| WO | WO00/11109 | 3/2000 | |

OTHER PUBLICATIONS

Yoshifusa et al., "Odor-and smoke-less fireproofing additives for resin composition", DATABASE CHEMABS Online! Aug. 8, 1999.

* cited by examiner

*Primary Examiner*—William H. Mayo, III
(74) *Attorney, Agent, or Firm*—Oliff & Berridge, PLC

(57) ABSTRACT

Flame-retardant adhesives for circuit materials which are harmless to the environment, show excellent thermo-humidity resistant electrical characteristics and have high flame retardancy.

These flame-retardant adhesives contain a saturated polyester resin and a flame retarder containing a component having P—C bond in its molecule and a component having nitrogen in its molecule, and the content of the flame retardant amounts to 90 parts by weight or more per 100 parts by weight of the saturated polyester resin.

6 Claims, 1 Drawing Sheet

FLAME-RETARDANT ADHESIVES AND CIRCUIT MATERIALS WITH THE USE OF THE SAME

FIELD OF THE INVENTION

This invention relates to techniques of flame-retardant adhesives to be used in producing circuit materials employed in, for example, electronic instruments.

BACKGROUND OF THE INVENTION

In recent years, there have been employed circuit materials such as flat cables as connectors for connecting connection terminals of different wiring boards of electronic instruments such as personal computers.

Such a circuit material consists of a definite number of conductors located between a pair of coating materials which are bonded to each other by, for example, thermo compression bonding. Since temperature is generally elevated to a considerably high level in electronic instruments, flame-retardant adhesives are required to bond coating materials.

There are known adhesives to be used in these circuit materials which contain halogen-based flame retarders or ammonium polyphosphate.

However, the conventional adhesives for circuit materials containing halogen-based flame retarders suffer from a problem that they generate halogen gases in the course of combustion and thus exert undesirable effects on the environment.

On the other hand, the conventional adhesives containing ammonium polyphosphate suffer from another problem that they are poor in the thermo-humidity resistant electrical characteristics, though they do not adversely affect the enviroment.

Although it is proposed to solve these problems by using an adhesive containing a nitrogen compound and zinc borate, this adhesive has a disadvantage of having a somewhat poor flame retardancy.

SUMMARY OF THE INVENTION

The present invention, which has been completed to solve the above described problems encountering in the prior art, aims at providing flame-retardant adhesives which are harmless to the environment, show excellent thermo-humidity resistant electrical characteristics and have high flame retardancy, and circuit materials with the use of these flame-retardant adhesives.

According to the first aspect, the present invention provides a flame-retardant adhesive which contains a saturated polyester resin and a flame retarder containing a component having P—C bond in its molecule and a component having nitrogen in its molecule, wherein the content of the flame retardant amounts to 90 parts by weight or more and 120 parts by weight or less per 100 parts by weight of the saturated polyester resin.

According to another aspect, the present invention provides a flame-retardant adhesive which comprises a saturated polyester resin and a flame retarder containing a component having P—C bond in its molecule, a component having nitrogen in its molecule and an acid component free from phosphorus in its molecule.

The present invention further provides the flame-retardant adhesive as described above wherein the content of said flame retarder amounts to 80 parts by weight or more and 120 parts by weight or less per 100 parts by weight of the saturated polyester resin.

The present invention further provides the flame-retardant adhesive as described above wherein the component having P—C bond in its molecule contained in said flame retarder is nitrilotrismethylenephosphonic acid.

The present invention furthermore provides the flame-retardant adhesive as described above wherein the component having nitrogen in its molecule contained in said flame retarder is melamine.

The present invention furthermore provides the flame-retardant adhesive as described above wherein the acid component free from phosphorus in its molecule is a compound containing melamine and cyanuric acid.

According to another aspect, the present invention provides a circuit material for electrically connecting electrodes to each other which comprises a definite conductor for forming a circuit, and coating materials for coating the conductor, wherein the coating materials are adhered by using a flame-retardant adhesive which comprises a saturated polyester resin, and a flame retarder containing a component having P—C bond in its molecule and a component having nitrogen in its molecule, and in which the content of said flame retarder amounts to 90 parts by weight or more per 100 parts by weight of said saturated polyester resin.

According to another aspect, the present invention provides a circuit material for electrically connecting electrodes to each other which comprises a definite conductor for forming a circuit, and coating materials for coating the conductor, wherein the coating materials are adhered by using a flame-retardant adhesive which comprises a saturated polyester resin, and a flame retarder containing a component having P—C bond in its molecule, a component having nitrogen in its molecule and acid component free from phosphorus in its molecule.

Because of containing a halogen-free flame retarder, the flame-retardant adhesive according to the present invention generates no halogen gas in the course of combustion and, therefore, does not adversely affect the environment.

Because of containing a component having P—C bond in its molecule and a component having nitrogen in its molecule, on the other hand, the flame-retardant adhesive according to the present invention exerts a synergistic effect of promoting the formation of a surface coating film, which has effects of blocking heat and oxygen, due to the condensation reaction of phosphorus in the course of combustion and forms water-insoluble salt, thereby improving the resistance against hydrolysis. As a result, the thermo-humidity resistant electrical characteristics and flame retardancy can be improved.

In the present invention, the content of nitrogen can be further elevated by adding an acid component free from phosphorus in its molecule to the flame retarder. Thus, a flame-retardant adhesive having a desired thermo-humidity resistant electrical characteristics and flame retardancy can be obtained by using the flame retarder in a smaller amount.

Figure 1:
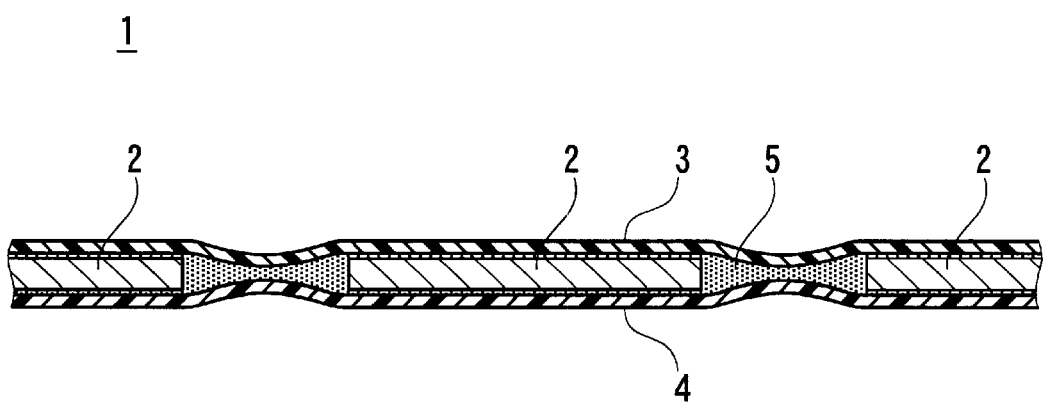
FIG. 1 is a sectional view showing an example of a flat cable which is the circuit material according to the present invention.

In this FIGURE, each numerical symbol has the following meaning:

| | |
|---|---|
| 1: | flat cable (circuit material) |
| 2: | conductor |
| 3: | coating material |
| 4: | coating material |
| 5: | flame-retardant adhesive |

DETAILED DESCRIPTION OF THE INVENTION

Now, embodiments of the flame-retardant adhesive according to the present invention and the circuit material with the use of the same will be described in detail by reference to the attached drawing.

FIG. 1 is a sectional view showing an example of a flat cable which is the circuit material according to the present invention.

As FIG. 1 shows, the flat cable 1 according to an embodiment of the present invention is formed by coating a definite number of conductors 2 for forming a circuit with a pair of coating materials 3 and 4. The coating materials 3 and 4 are bonded to each other by using a flame-retardant adhesive 5 according to the present invention as will be described hereinafter.

As the conductor 2 to be used in the present invention, it is possible to employ a conductor in the form of a long square plate made of copper. The thickness of the conductor 2 is from about 18 to 100 μm.

Although the coating materials 3 and 4 may be made of arbitrary materials without restriction, it is preferable to use polyester coating materials from the viewpoint of cost, etc.

Although the coating materials 3 and 4 are not restricted in thickness too, the thickness thereof preferably ranges from several μm to several hundred μm, still preferably from 12 to 250 μm, in view of handling properties.

On the other hand, the flame-retardant adhesive 5 according to the present invention contains a saturated polyester resin and a flame retarder.

In the present invention, various saturated polyester resins may be used without particular restriction. From the viewpoint of flame retardancy, it is favorable to use a saturated polyester resin containing a polyvalent carboxylic acid having phosphate group.

As an example of such a polyester resin, UE2000 (manufactured by Unitika Ltd.) may be cited.

On the other hand, the flame retarder contained in the flame-retardant adhesive 5 of the present invention contains a component having P (phosphorus)-C (carbon) bond in its molecule and a component having nitrogen in its molecule.

The component having P—C bond in its molecule is exemplified by nitrilotrismethylenephosphonic acid represented by the following formula (1).

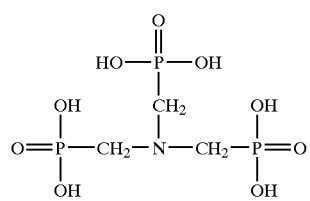
(1)

On the other hand, the component having nitrogen in its molecule is exemplified by melamine represented by the following formula (2).

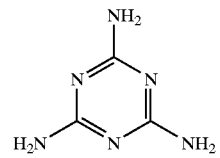
(2)

In the present invention, it is appropriate to use a salt compound composed of the above-described nitrilotrismethylenephosphonic acid and melantine bonded to each other via an ionic bond.

On the other hand, it is favorable in the present invention that the content of the above-described flame retarder amounts to 90 parts by weight or more per 100 parts by weight of the saturated polyester resin.

When the content of the flame retarder is less than 90 parts by weight per 100 parts by weight of the saturated polyester resin, no sufficient flame retardancy can be established.

On the other hand, it is preferable that the content of the flame retarder is regulated to not more than 120 parts by weight per 100 parts by weight of the saturated polyester resin.

When the content of the flame retarder exceeds 120 parts by weight per 100 parts by weight of the saturated polyester resin, there arises a problem that the pealing strength is lowered.

The flame retarder in the flame-retardant adhesive 5 according to the present invention may further contain an acid component free from phosphorus in its molecule.

As an example of the acid component free from phosphorus in its molecule, a compound containing the above-described melamine and cyanuric acid represented by the following formula (3) may be cited.

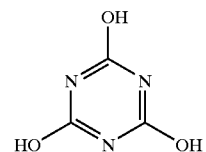
(3)

In the present invention, it is possible to adequately use, for example, a melamine-cyanuric acid adduct which is advantageous because of being inexpensive.

It is preferable in the present invention that the content of the flame retarder amounts to 80 parts by weight or more per 100 parts by weight of the saturated polyester resin.

When the content of the flame retarder is less than 80 parts by weight per 100 parts by weight of the saturated polyester resin, no sufficient flame retardancy can be established.

On the other hand, it is preferable that the content of the flame retarder is regulated to not more than 120 parts by weight per 100 parts by weight of the saturated polyester resin.

When the content of the flame retarder exceeds 120 parts by weight per 100 parts by weight of the saturated polyester resin, there arises a problem that the pealing strength is lowered.

The flame-retardant adhesive 5 according to the present invention may further contain additives such as crosslinking agents, pigments, inorganic fillers, antioxidants, aging-resistant agents and coupling agents depending on the purpose.

The flame-retardant adhesive 5 according to the present invention can be obtained by dissolving the saturated polyester resin in a solvent, such as methyl ethyl ketone, adding the flame retarder thereto and dispersing it by sufficiently stirring.

EXAMPLES

To further illustrate the present invention in greater detail, the following Examples and Comparative Examples will be given.
(Preparation of Flame-retardant Adhesive)

Example 1

In 100 parts by weight of a saturated polyester resin (UE2000), 100 parts by weight of melamine nitrilotrismethylenephosphonic compound (N6ME manufactured by Nippon Chemical Industrial Co., Ltd.) was added and dispersed by using a toluene solvent to thereby give a target flame-retardant adhesive.

Example 2

In 100 parts by weight of a saturated polyester resin (UE2000), 60 parts by weight of the same melamine nitrilotrismethylenephosphonate as employed in Example 1 and 20 parts by weight of a melamine-cyanuric acid adduct (MC610 manufactured by Nissan Chemical Industries, Ltd.) were added by using a toluene solvent to thereby give a target flame-retardant adhesive.

Example 3

A flame-retardant adhesive was obtained as in Example 2 but using 40 parts by weight of the melamine nitrilotrismethylenephosphonate compound and 40 parts by weight of the melamine-cyanuric acid adduct.

Example 4

A flame-retardant adhesive was obtained as in Example 2 but using 20 parts by weight of the melamine nitrilotrismethylenephosphonate compound and 60 parts by weight of the melamine-cyanuric acid adduct.

Comparative Example 1

A flame-retardant adhesive was obtained as in Example 1 but using 100 parts by weight of the melamine-cyanuric acid adduct as a substitute for the melamine nitrilotrismethylenephosphonate compound.

Comparative Example 2

A flame-retardant adhesive was obtained as in Example 1 but using 100 parts by weight of a melamine sulfate compound (Apinon 901 manufactured by Sanwa Chemical Co., Ltd.) as a substitute for the melamine nitrilotrismethylenephosphonate compound.

Comparative Example 3

A flame-retardant adhesive was obtained as in Example 1 but using 100 parts by weight of a melamine polyphosphate compound as a substitute for the melamine nitrilotrismethylenephosphonate compound.
(Evaluation)
[Flame Retardancy]

Flat cables were manufactured by using the flame-retardant adhesives of the above-described Examples and Comparative Examples and subjected to a vertical firing test (VW-1) based on UL standard to thereby evaluate the flame retardancy of each sample. Table 1 summarizes the results.

In Table 1, ⊙ stands for showing an excellent flame retardancy; ○ stands for showing a somewhat poor but practically acceptable flame retardancy; and × stands for showing a practically troublesome flame retardancy.
[Electrical Characteristics After Thermo-humidity Aging]

By using the flame-retardant adhesives of the above-described Examples and Comparative Examples, a test was carried out in accordance with JIS C6471 to thereby evaluate the electrical characteristics of each sample after thermo-humidity aging. Table 1 summarizes the results.

In Table 1, ○ stands for showing practically acceptable electrical characteristics ($1 \times 10^8$ to $1 \times 10^{10}$ Ω); and × stands for showing practically troublesome electrical characteristics (less than $1 \times 10^8$ Ω).

TABLE 1

Evaluation data of samples of Examples and Comparative Examples

|  | Polyester resin | Melamine nitrilotirismethylene-phosphonate | Melamine-cyanurate | Melamine sulfate | Melamine polyphosphate | Flame retardancy | Electrical characteristics after thermo-humidity aging |
|---|---|---|---|---|---|---|---|
| Ex.1 | 100 | 100 | — | — | — | ⊙ | ○ |
| Ex.2 | 100 | 60 | 20 | — | — | ○ | ○ |
| Ex.3 | 100 | 40 | 40 | — | — | ○ | ○ |
| Ex.4 | 100 | 20 | 60 | — | — | ○ | ○ |
| C.Ex.1 | 100 | — | 100 | — | — | × | ○ |
| C.Ex.2 | 100 | — | — | 100 | — | × | × |
| C.Ex.3 | 100 | — | — | — | 100 | ⊙ | × |

Note
each content is expressed in parts by weight.

As Table 1 clearly shows, the flame-retardant adhesives of Examples 1 to 4 showed good results both in flame retardancy and electrical characteristics after thermo-humidity aging.

Among all, the flame-retardant adhesive of Example 1 containing the melamine nitrilotrismethylenephosphonate compound alone as the flame retarder showed an excellent flame retardancy.

In contrast, the flame-retardant adhesive of Comparative Example 1, which contained the melamine-cyanuric acid adduct as a substitute for the melamine nitrilotrismethylenephosphonate compound, and the flame-retardant adhesive of Comparative Example 2, which contained the melamine sulfate compound, were inferior in the flame retardancy.

Moreover, the electrical characteristics of the flame-retardant adhesive of Comparative Example 2 and the flame-retardant adhesive of Comparative Example 3, which contained the melamine polyphosphate compound, were worsened after the thermo-humidity aging.

As described above, the present invention can provide flame-retardant adhesives for circuit materials which are harmless to the environment, show excellent thermo-humidity resistant electrical characteristics and have high flame retardancy.

What is claimed is:

1. A flame-retardant adhesive comprising:

a saturated polyester resin; and a flame retarder containing, a salt compound composed of nitrilotrismethylene phosphonic acid and melamine bonded to each other via an ionic bond, and a melamine-cyanulic acid adduct in its molecule.

2. The invention as claimed in claim 1 wherein the content of said flame retarder amounts to 80 parts by weight or more and 120 parts by weight or less per 100 parts by weight of said saturated polyester resin.

3. The invention as claimed in claim 1, wherein said melamine-cyanulic acid adduct is a compound containing melamine and cyanuric acid.

4. The invention as claimed in claim 2, wherein said melamine-cyanulic acid adduct is a compound containing melamine and cyanuric acid.

5. A circuit material for electrically connecting electrodes to each other comprising:

a definite conductor for forming a circuit; and coating materials for coating said conductor;

wherein said coating materials are adhered by using a flame-retardant adhesive which comprises a saturated polyester resin, and a flame retarder containing a salt compound composed of nitrilotrismethylene phosphonic acid and melamine bonded to each other via an ionic bond, and melamine-cyanulic acid adduct in its molecule.

6. A flat cable comprising a definite conductor for forming a circuit; and coating materials for coating said conductor; and the thickness of said coating material ranges from $12\mu$ to 250 $\mu$m;

wherein said coating materials are adhered by using a flame-retardant adhesive which comprises a saturated polyester resin, and a flame retarder containing a salt compound composed of nitrilotrismethylene phosphonic acid and melamine bonded to each other via an ionic bond and melamine-cyanulic acid adduct in its molecule, wherein the content of flame retarder amounts to 90 parts by weight or more per 100 parts by weight of said saturated polyester resin.

* * * * *